United States Patent [19]

Nauerth

[11] Patent Number: 5,510,710
[45] Date of Patent: Apr. 23, 1996

[54] MAGNETIC RESONANCE IMAGING WITH COMBINED SINGLE POINT AND BACK PROJECTION DATA TAKING METHOD

[75] Inventor: Arno Nauerth, Erlenbach, Germany

[73] Assignee: Bruker Medizintechnik GmbH, Germany

[21] Appl. No.: 351,661

[22] Filed: Dec. 8, 1994

[30] Foreign Application Priority Data

Dec. 16, 1993 [DE] Germany ............ 43 43 022.8

[51] Int. Cl.⁶ .................. G01V 3/00; G01V 3/14
[52] U.S. Cl. ........................... 324/307; 324/309
[58] Field of Search .................. 324/300, 307, 324/309, 311, 312, 314

[56] References Cited

U.S. PATENT DOCUMENTS

| | | |
|---|---|---|
| 4,706,026 | 11/1987 | Pelc et al. |
| 4,727,325 | 2/1988 | Matsui .................. 324/309 |
| 4,812,762 | 3/1989 | Den Boef ............... 324/309 |
| 5,243,284 | 9/1993 | Noll . |

FOREIGN PATENT DOCUMENTS

| | | | |
|---|---|---|---|
| 0401908 | 12/1990 | European Pat. Off. | G01R 33/56 |
| 4232731 | 4/1994 | Germany | G01N 24/08 |
| 4219610 | 10/1994 | Germany | G01N 24/08 |

OTHER PUBLICATIONS

Kashmar, G. C. et al.: Fast NMR Imaging by Concentric Sampling, in: IEEE Transactions on Nuclear Science, vol. 33, No. 1, 1986, pp. 560–564.
Ortendahl, D. A. et al.: A Comparison of the Noise Characteristics of Projection Reconstruction and Two-Dimensional Fourier Transformations in NMR Imaging, in: IEEE Transactions on Nuclear Science, vol. NS–30, No. 1, 1983, pp. 692–696.
Nauerth, A. et al.: SPI–Single Point FID Imaging. In: 12th Annual Scientific Meeting der SMRM, Aug. 1993, New York, Contributions p. 1215.
Morris, P. G.: Nuclear Magnetic Resonance Imaging in Medicine and Biology, Oxford Science Publications, Clarendon Press, Oxford, 1986, § 4.1.

*Primary Examiner*—Sandra L. O'Shea
*Assistant Examiner*—Mark Haynes
*Attorney, Agent, or Firm*—Walter A. Hackler

[57] ABSTRACT

A magnetic resonance method is utilized for taking an image of an object. An initial projection is taken by applying a gradient magnetic field having a predetermined direction $\phi$ and strength G, irradiating a high frequency excitation pulse and sequentially measuring a nuclear resonance signal from the object. The signal dephases under the influence of the gradient magnetic field and the signal measuring points are assigned to points in k-space lying along a vector whose direction is determined by the direction $\phi$ of the gradient magnetic field, and whose magnitude by the product of the strength of the gradient magnetic field and the time interval between the excitation pulse and the taking of the corresponding measuring point. A further number of n-1 (n>>1) projections are obtained by changing the direction and/or strength of the gradient magnetic field. Additional excitations and measurements are carried out for an additional n'≤n projections having measuring points. The gradient strengths and the waiting time $t_w{'}$ of the additional excitations are adjusted and the image is reconstructed from the total number measuring points.

19 Claims, 5 Drawing Sheets

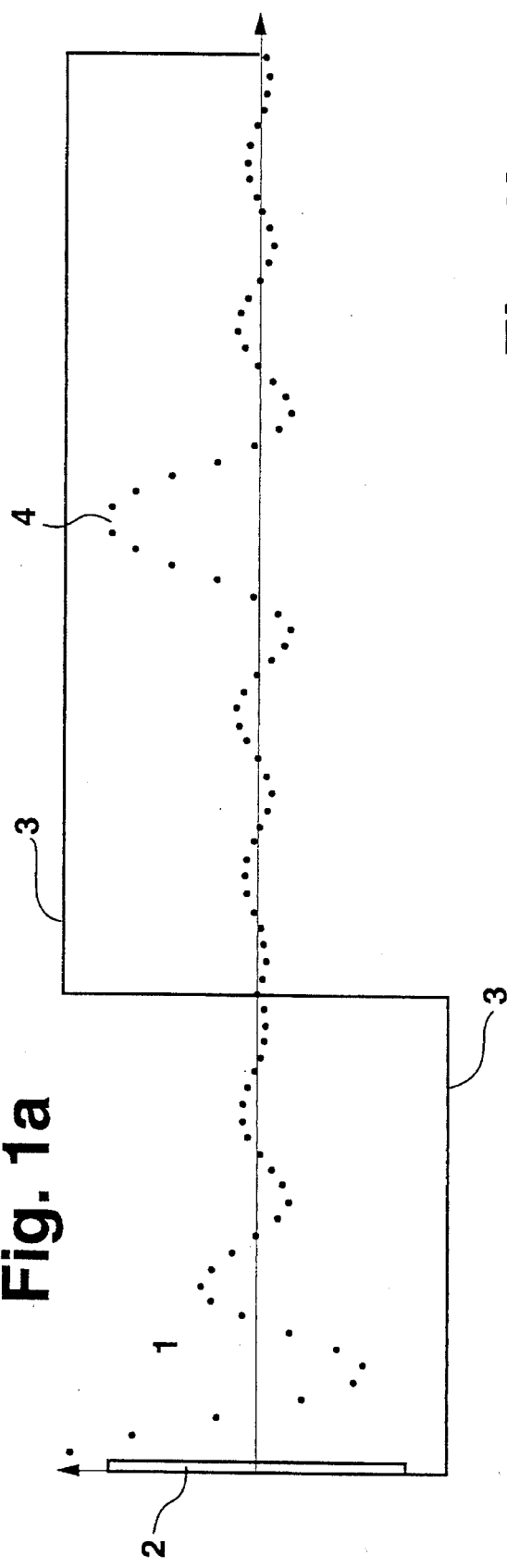
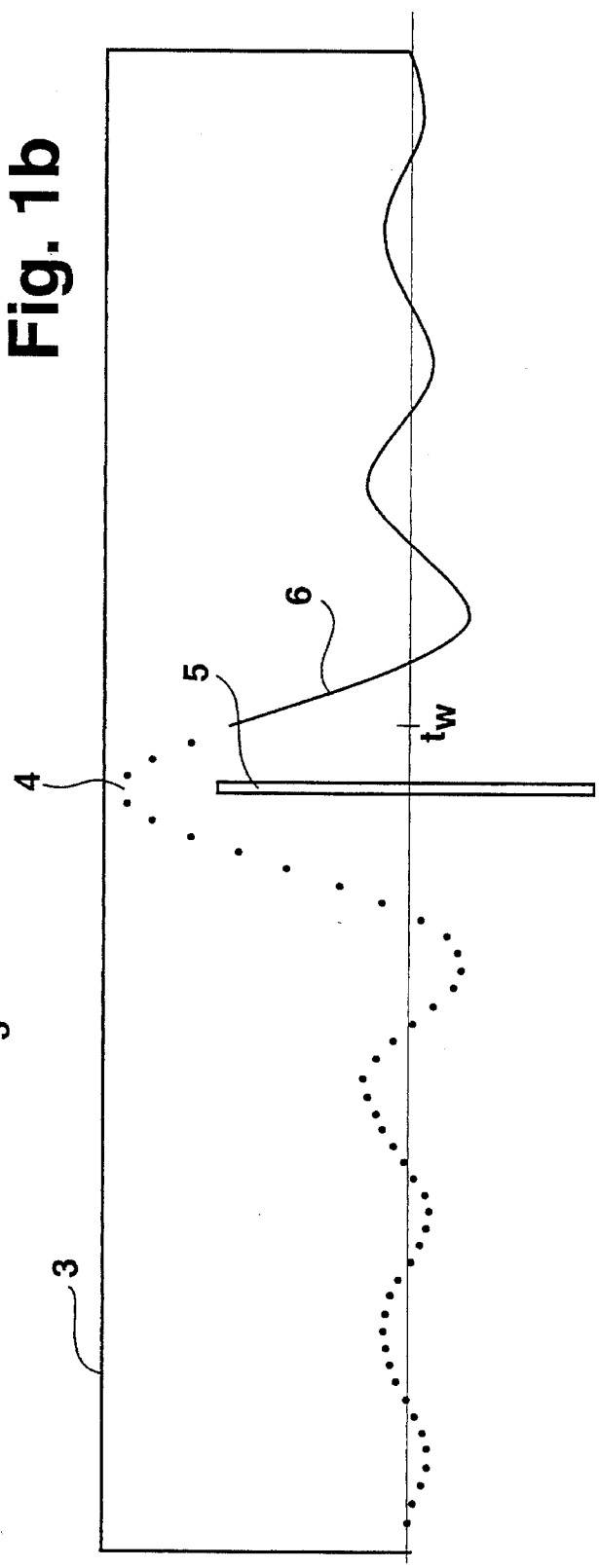

MAGNETIC RESONANCE IMAGING WITH COMBINED SINGLE POINT AND BACK PROJECTION DATA TAKING METHOD

BACKGROUND OF THE INVENTION

The invention concerns a magnetic resonance imaging method with which an image of an object, located in a homogeneous magnetic field, is obtained. An initial projection is taken by applying a gradient magnetic field having a predetermined direction $\phi$ and strength G, irradiating a high frequency excitation pulse and, following a waiting time $t_w$ and with a predetermined sampling rate, sequentially measuring points of a nuclear resonance signal from the object. The signal dephases under the influence of the gradient magnetic field $G\phi$ and the measuring points are assigned to points in k-space lying along a vector extending from the origin. The direction of the vector is determined by the direction $\phi$ of the gradient magnetic field, and the separation of each of the measuring points from the origin is given by the product of the strength of the gradient magnetic field and the time interval between the excitation pulse and the taking of the corresponding measuring point. Additional n-1 (n>>1) projections are then taken after changing the direction and/or strength of the gradient magnetic field and the excitation, waiting time $t_w$, and segmental measurements are repeated (n-1) times. An image of the object is constructed from the measuring points of all n projections using a reconstruction algorithm.

A method of this type is, for example, known to those of skill in the art as the so-called projection reconstruction method (back projection) and now constitutes basic knowledge in the area of magnetic resonance (see for example the textbook "Nuclear Magnetic Resonance Imaging in Medicine and Biology" by P. G. Morris, Oxford Science Publications, Clarendon Press, Oxford, 1986, §4.1).

A method is known in the art from the article "SPI-Single Point FID Imaging" by A. Nauerth and B. Gewiese, conference contribution to the $12^{th}$ Annual Scientific meeting of SMR, 14th–20th August 1993, New York, p. 1215, with which precisely one measuring point is taken after each high frequency excitation so that each point in k-space corresponds to one excitation ("Single Point Imaging" = SPI). The applicant's subsequently published German patent applications P 42 9 610.8, P 42 32 731.8 as well as P 43 34 038.5 likewise concern the so-called "SPI method" or variations thereof.

In the conventional imaging method the measurement signals are generally taken by measuring and digitizing a spin echo or a gradient echo signal following the high frequency excitation. Since one first allows the NMR signal to dephase following excitation and to rephase with the assistance of a 180° pulse or through gradient inversion, one avoids problems associated with the fact that, directly following excitation, the receiver is overloaded and a certain minimum amount of time $t_w$ must be waited before switching from transmission to reception. For this reason, when using the original signal ("Free Induction Decay"=FID), the initial NMR signal portion is not accessible to measurement. However, neglecting this signal portion leads to enormous base line problems when Fourier transforming which renders good image reconstruction impossible. The echo signal solution is an elegant one and has significant advantages. However, this method increases the time interval between excitation and the taking of data which, in particular with investigational objects having short relaxation times $T_2$, limits its applicability. Towards this end, the SPI method offers an alternative with which one can work with the shortest of intervals. However, this advantage is at the extreme expense of the total measuring time, since each single point in k-space must be measured individually. This cannot, in particular, be tolerated with three dimensional objects and/or biological or living samples.

It is therefore the object of the present invention to present a method which, with acceptable total measuring time, exhibits a shortened time interval between excitation and measurement compared to the echo measurement while nevertheless taking advantage of measuring points with reduced dephasing after the excitation pulse, i.e. at small k-values, for image reconstruction.

SUMMARY OF THE INVENTION

This purpose is achieved with the method of the above mentioned kind in that additional excitations and measurements for n'≦n projections having waiting times $t_w$' and measuring points are carried out, whereby the gradient strength and waiting times $t_w$' are adjusted and the image is reconstructed from all measuring points.

In a preferred variation of the method in accordance with the invention precisely one measuring point is taken (i'=1) after each of the n additional excitations. This corresponds to the conventional SPI method and is easily implemented on available apparatuses.

A further improved embodiment provides that the gradient magnetic fields be changed in such a fashion that all measuring points in k-space lie on concentric circles. This corresponds to the standard projection reconstruction method (back projection) for which an analysis algorithm is available which is normally stored in almost all professional installations.

A variation of the method is very well suited for the two dimensional Fourier transformation (2d-FT) analysis with which the gradient magnetic fields are changed in such a fashion that all measuring points in k-space lie on rectangles, preferentially, on concentric squares.

In a further embodiment of the method in accordance with the invention the gradient magnetic fields are changed in such a fashion that all measuring points in k-space lie on concentric spherical shells. In this fashion 3-dimensional imaging is made possible with the standard projection reconstruction method for which, as mentioned above, the analysis algorithms are readily available.

A variation of the method, which is better adapted to 3d-FT analysis, provides that the gradient magnetic fields be changed in such a fashion that all measuring points in k-space lie on the surfaces of cylinders nested within each other, in particular, on the surfaces of cubes.

The analysis algorithm is particularly simple with a variation of the method in accordance of the invention with which n'=n.

In order to achieve reduced measuring times, an alternative variation has n'<<n. In this fashion measuring points lying near k=0 are eliminated. These points are, however, superfluous, since high point density is already present in this region.

In a further advantageous variation of the method, the image reconstruction takes place according to the projection reconstruction algorithm. This algorithm is particularly well suited to the present measuring method and, as mentioned above, is already available on most installations.

A variation of the method in accordance with the invention which, in some respects, has reduced artefacts, provides that new measuring points be calculated from the measuring points to form an even quadratic or cubic grid in k-space and the image reconstruction is carried out from these new measuring points with the assistance of a 2d or 3d Fourier transformation algorithm. This variation of the method is adapted to 2d-FT or 3d-FT methods, using conventional algorithms. This method variation is particularly advantageous when n'<<n.

An improvement of this variation of the method is characterized in that the rectangular or parallelepiped-shaped measuring region of two or three dimensional k-space is subdivided into equally sized rectangles or parallelepipeds, the centers of which are each assigned to a new measuring point. The new measuring points are given by the measuring point closest to the corresponding center within the corresponding rectangle or parallelepiped or are set equal to zero when no measuring point is located within the corresponding rectangle or parallelepiped.

In another improvement the gradient strengths and gradient directions are adjusted in such a fashion that each rectangular side or parallelepiped side within the rectangular-shaped or parallelepiped-shaped measuring region in k-space contains at least, and preferentially exactly, one measuring point.

Further advantages of the invention are given in the description and the accompanying drawing. The above mentioned features as well as those to be described further below can be utilized in accordance with the invention individually or collectively in arbitrary combination. The embodiments and variations of the method in accordance with the invention are not to be considered as exhaustive enumeration, rather have exemplary character only.

The invention is represented in the drawing and will be more closely described and explained in concrete examples.

BRIEF DESCRIPTION OF THE DRAWING

FIG. 1a shows the time development of an NMR signal following an excitation pulse with gradient
inversion (gradient echo), FIG. 1b shows the time dependence of an NMR signal after an excitation pulse, with constant gradient, complemented to negative times, whereby the measurable portion is indicated by heavy lines;

DESCRIPTION OF THE PREFERRED EMBODIMENT

Figure 2:
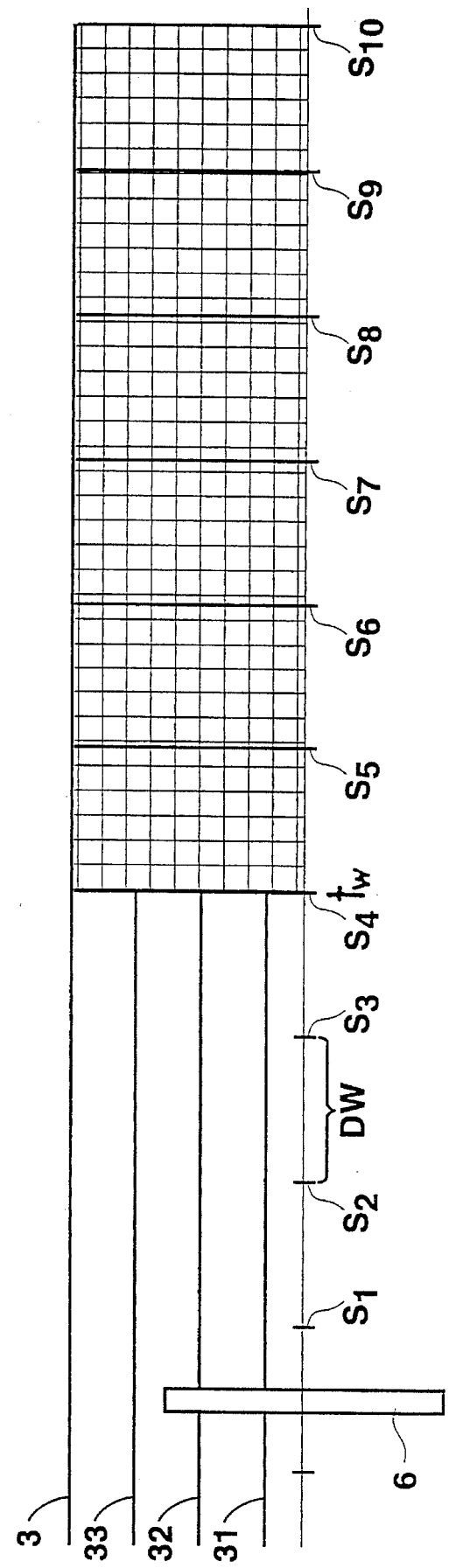
FIG. 2 shows a means for obtaining missing measuring points occurring in the waiting time interval $t_w$ following the excitation pulse using subsequent measurements with reduced gradient strength at time point $t_w$.

FIG. 1a shows, in detail, the time dependence of the NMR signal 1 after a high frequency excitation pulse 2 with the production of a spin echo by means of a switched gradient 3. The excitation pulse is, normally, a 90° pulse but, however, can also have smaller flip angles. The signal 1 initially dephases under the influence of the negative gradient 3 and is rephased by gradient reversal, so that a signal maximum 4 occurs which is symmetric to the signal 1 in the vicinity of the positive gradient 3. Both sides of the echoes can be measured for purposes of analysis or only one side can be measured and the other symmetrically complemented. Measurements precisely at the maximum present no difficulties. The intrinsically symmetric dependence of the signal 1 is overlapped with an exponential decay due to $T_2$ relaxation (not shown here). In order to reconstruct an image, a plurality of such signal dependences (projections) are taken with different gradient directions and processed with the projection reconstruction algorithm.

FIG. 1b reproduces the initial dependence of the signal of FIG. 1a for positive gradients 3 in an enlarged representation. It is, however, also possible to interpret the figure differently. A high frequency pulse 5 is drawn precisely at the point of time of the signal maximum 4 which can be conceptualized as an excitation pulse. The portion of the signal adjacent thereto in time then represents a free induction decay (FID) due to the excitation pulse 5. The preceding time portion now has, at best, only theoretical significance and does not exist as a real signal. The portion 6 of the signal 1 which is measurable is drawn as a heavy line and begins after the waiting time $t_w$. Although the signal is present during the interval $t_w$, it cannot be reliably detected for technical reasons. If one therefore intends to reconstruct an image from the detectable signal portions, information concerning the first data points following the excitation pulse 5 is missing in each projection due to the waiting time $t_w$. One can, in general, attempt to artificially complement these points through extrapolation. This, however, leads to significant problems and errors in the reconstruction.

FIG. 2 shows how these missing measuring points can be complemented through additional measurements. An excitation pulse 5 is once more shown. The waiting time $t_w$, subsequent thereto, is largely determined by the apparatus. This time is preferentially an odd multiple of half of the so-called "dwelltime" (DW) which determines the cycling time of the data acquisition. Following time $t_w$, the signal is read out and digitalized (hatched region) with this cycling time (DW). All data points necessary for a projection ($S_4$ and the following), with the exception of those occurring in the time interval $t_w$ ($S_1$ through $S_3$), are taken with a single excitation. Towards this end, the maximum gradient 3 is present in FIG. 2.

In order to complete the projection an additional data point ($S_3$) is recorded with a second excitation having reduced gradients 33 after the time $t_w$. This data point corresponds to one which would have been recorded in the original excitation within interval $t_w$. Although the relative measuring point time is increased to $t_w$, the effective gradient has been correspondingly reduced so that the dephasing is correct. However, there are differences with regard to relaxation effects which one has to accept.

One acts in a corresponding fashion when taking the remaining data points ($S_1$ through $S_2$). The sequence of the measurements does not matter. It is also possible, if allowed by the waiting time, to partially measure a plurality of data points with the same excitation as long as the corresponding time points lie near or outside $t_w$. It is also possible, in order to improve the signal to noise (S/N) ratio, to take additional data at later relative times and to overlap these with those already measured (which have the same dephasing). In this fashion one mixes more data having different relaxation effects which, depending on the application, could, in fact, be desirable.

Since the measuring point density is very high in the vicinity of k=0, it is not necessary to measure all remaining data points of all projections.

It is possible to increase the waiting time $t_w$ beyond the minimum value required for technical reasons in order to intentionally vary the influences of the relaxation time $T_2$ or $T_2^*$.

Figure 3:
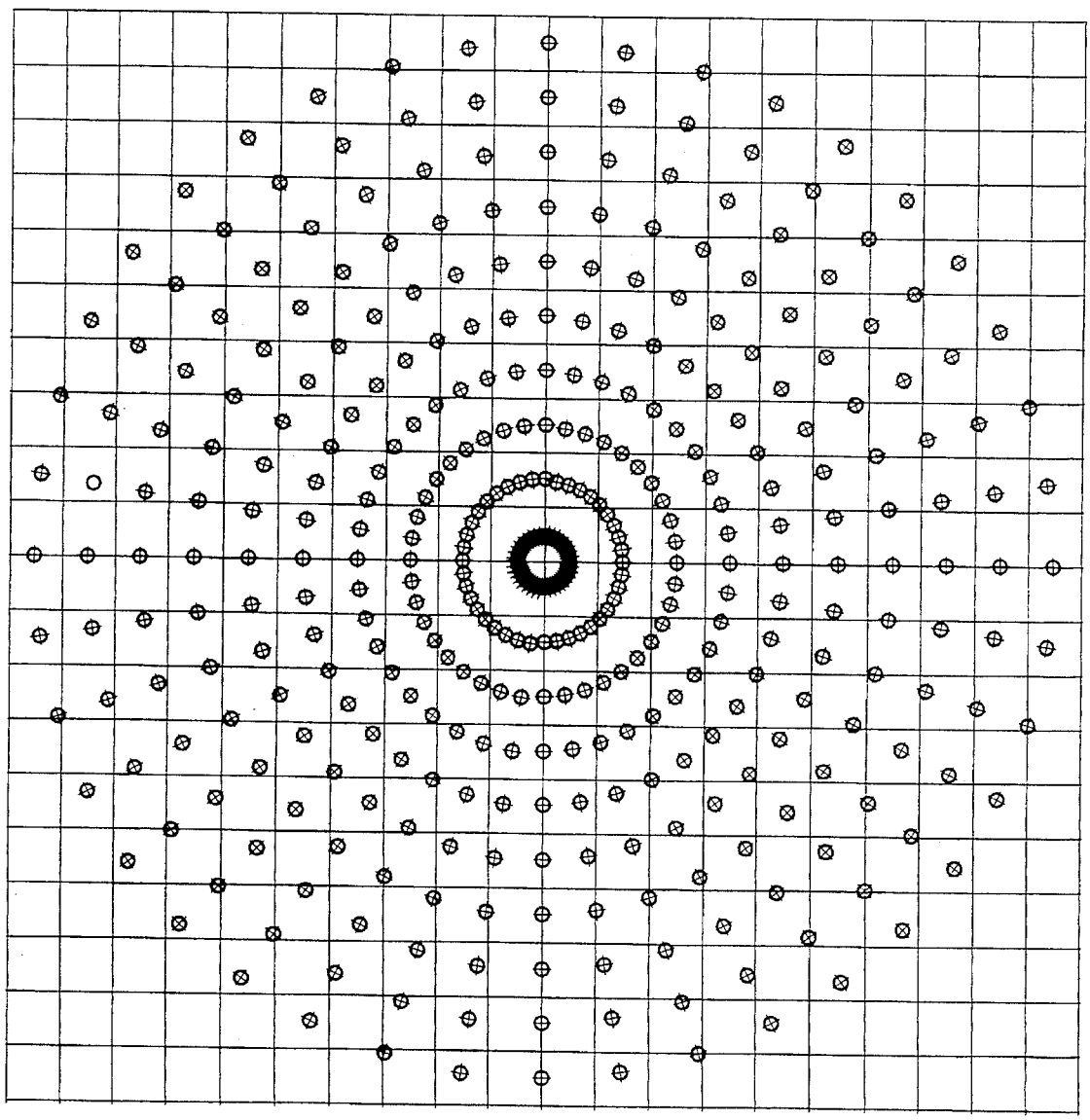
FIG. 3 shows a representation of the position of the measuring points in two-dimensional k-space with the conventional projection reconstruction method.

FIG. 3 shows the position of the measuring points in k-space for the two-dimensional case of the conventional projection reconstruction (PR) method. They lie on concentric equidistant arcs about k=0. Each arc contains the same number of measuring points, i.e. the density of the points in k-space decreases with increasing magnitude of k. With the conventional PR method a magnetic field of constant magnitude is applied in correspondence with FIG. 1 or FIG. 2 and data are recorded corresponding to measuring points along a fixed radius vector in k-space. The gradient is then rotated and another "projection" is taken. This occurs in a plane, in general, over at least 180°. An image can be subsequently reconstructed using the above mentioned reconstruction algorithm for the PR method. The method can be extended to three dimensions through corresponding increase in the number of projections and, therewith, in the total measuring time.

In methods in accordance with the invention the measuring points can be taken along each projection as described in connection with FIG. 2, i.e. the measuring points on the j' innermost circle can be taken separately with changed gradient strengths.

Figure 4:
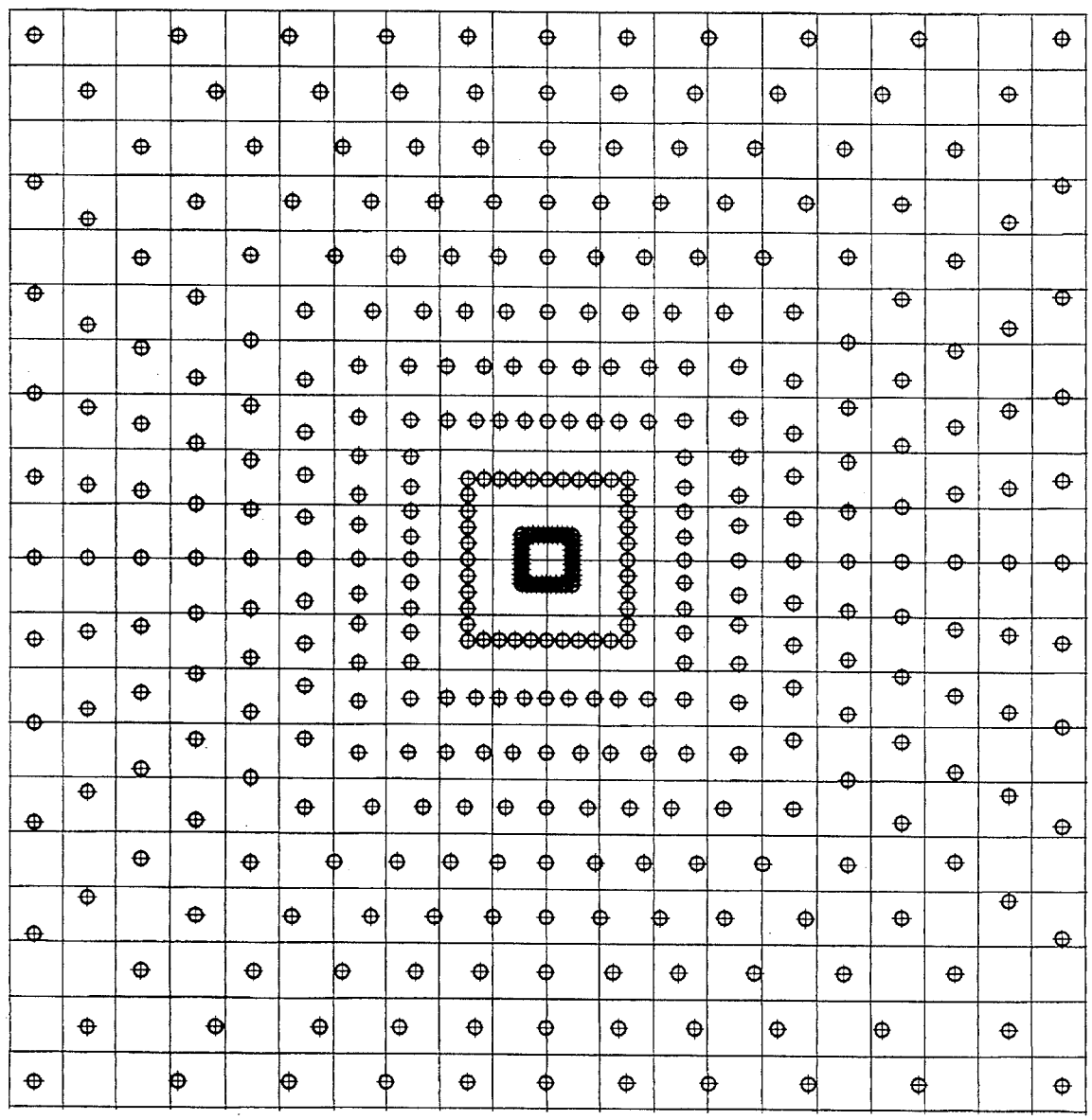
FIG. 4 shows the projection reconstruction method (PR) with variable gradient strength and position of the measuring points on the sides of squares.

FIG. 4 shows, analogous to FIG. 3, the position of the measuring points for a modified method with which the projection methods are largely maintained during excitation and data recording, i.e. n projections which differ from each other by a fixed angle increment $\Delta\phi$ are taken in a plane. The gradient strength is, however, changed from projection to projection so that the measuring points no longer lie on circular arcs, rather on the sides of squares. The number of measuring points per projection remains, in general, constant.

The gradient strength, in dependence on the angle of rotation $\phi$, has magnitude $$|G(\phi)| = \left| \frac{G(0)}{\cos(\phi)} \right| \quad 0 \leq \phi \leq 45°$$

This leads to the fact that a square, rather than a circular area, is filled with data points. Otherwise the data acquisition occurs as described in connection with FIGS. 2 and 3. Extension to three dimensions is furthermore possible leading to cubic, parallelepiped-shaped, or cylinder-shaped coverage in k-space.

For the further processing of the measuring data, i.e. for the reconstruction of an image, it is often desirable for the measuring points in k-space to lie on equidistant points in a Cartesian coordinate system. In this case the so-called 2d-FT or 3d-FT algorithm can, be directly utilized for reconstruction. This algorithm is currently utilized most frequently (see for example the above mentioned book of Morris, §4.2) and, in general, is free from artefacts and much faster for certain types of computers (without array processors).

The k-plane is, in each case, subdivided into 20*20=400 small squares in FIGS. 3 and 4, and 40 projections with 10 data points each, i.e. 400 data points are measured. In order to map into a configuration which is suitable for the FT-algorithm, the (in the simplified example) 400 measured data points must be assigned to the 400 Cartesian grid coordinates. Clearly, this is easier to do in FIG. 4 than in FIG. 3.

In the following, several methods will be described with which this mapping can take place in a reasonable fashion.

A very simple but, in many cases, perfectly adequate version assigns a point to each square in which exactly one point lies. Should more than one point lie within a square then either an average value is formed or only the point closer to the center of the square is utilized. Should a square contain no measuring points, it is assigned the value zero. This approximation is acceptable, since such squares are present only on the edge of the measuring region, i.e. at large k-magnitudes or at long times after excitation when the signal has already died-off. Each square in the plane represents a k-vector which extends from k=0 to the center of a square. Instead of simple mapping, a weighted average of a plurality of points in the square itself or from the neighboring squares can be mapped to a square, which of course increases the computer requirements, or a reasonable dependence can be fitted.

In order to prevent the occurrence of "empty" squares the number of projections can also be increased so that at least one point lies in each of the small peripheral squares over the entire extent of the square region spanned in k-space.

These methods can be logically extended to three dimensions, with the squares becoming cubes or segments of hollow cylinders.

Figure 5:
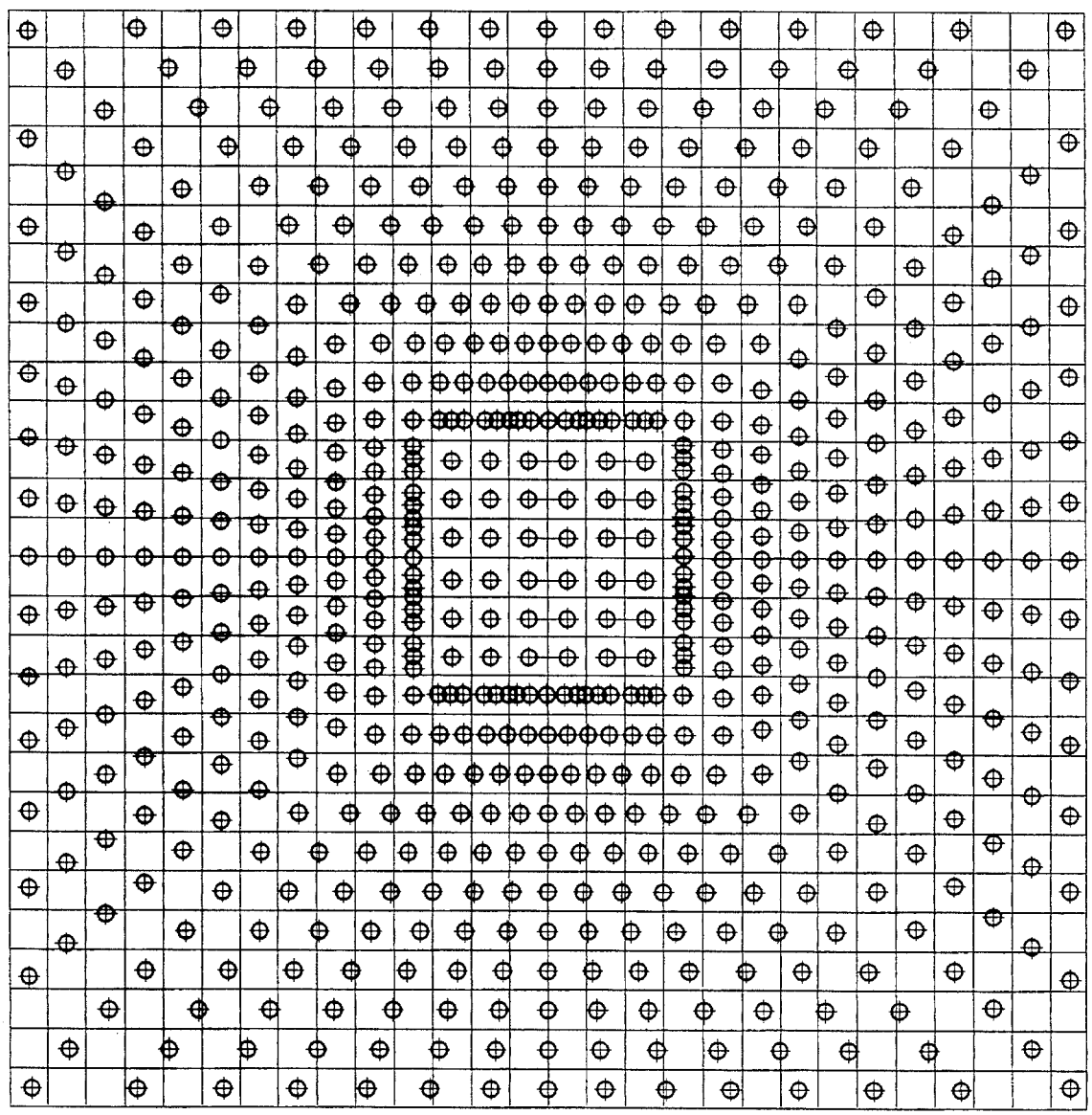
FIG. 5 shows the position of measuring points on the sides of squares in two dimensional k-space with a modified PR method having reduced measuring point density for small k-values.

One sees from FIG. 4 that the point density is quite high in the vicinity of k=0. If the measuring points in the vicinity of the innermost squares are, in any event, measured with separate excitations and if one attempts to map into a Cartesian coordinate, it is possible to then drastically reduce the number of measuring points in this inner region or to intentionally separately record the measuring points in the center of the initially reserved squares using "single point imaging". This is represented in FIG. 5. With the 40 projections having an original total of 400 measuring points, the first three measuring points are, in each case, eliminated (a total of 40*3=120), since they lie within the waiting time $t_w$. They are replaced by 6*6=36 individual point recordings with reduced gradient values. The entire number of data points in this example is reduced to 280+36=316, to cause a significant time advantage and without disadvantages, since a sufficient number of points for reconstruction are still available in the vicinity of k=0.

Clearly, this method can be extended to three dimensions.

The examples of the figures only utilize a few projections and data points for reasons of clarity. Clearly, this is not intended in any fashion to represent a limitation. Usually, one works in a plane having 128 or 256 projections and digitalizes exactly as many measuring points per projection. These numbers are adapted to the experimental conditions.

We claim:

1. A magnetic resonance method for imaging an object comprising the steps of:
   a) locating the object in a homogeneous base magnetic field;
   b) acquiring, using a back projection method n>>1 different projections with different directions $\phi(i)$ by carrying out the following steps ba) to bd) n times with i=1 to n:
      ba) applying a gradient magnetic field $G\phi(i)$ having a predetermined direction $\phi(i)$, different for every i, and a strength G(i) for acquiring a projection p(i);

bb) irradiating a high frequency excitation pulse into the object;

bc) waiting a time $t_w$';

bd) measuring, at a predetermined sampling rate, (j–m) >>1 measuring points $S_{m+1}(i)$ to $S_j(i)$, which are sequential in time, of a nuclear resonance signal from the object, the signal dephasing under the influence of the gradient magnetic field $G\phi(i)$, the measuring points $S_{m+1}(i)$ to $S_j(i)$ corresponding to j–m points in k-space lying along a vector extending from a k-space origin in the direction $\phi(i)$ of the gradient magnetic field $G\phi(i)$, whereby the separation of each of the j–m points $S_{m+1}(i)$ to $S_j(i)$ in k-space from the k-space origin is given by a product of the strength $G(i)$ of the gradient magnetic field $G\phi(i)$ and a time interval between the high frequency excitation pulse and the sampling time of the corresponding measuring points$_{m+1}(i)$ to $S_j(i)$;

c) acquiring, using a single point imaging method (S by PI), n'≤n*m additional measuring points $S(i')$ by carrying out the following steps ca) to cd) n' times with i'=1 to n':

ca) applying a gradient magnetic field $G\phi(i')$ having a predetermined direction $\phi(i')$ and a strength $G(i')$ for acquiring only one measuring point $S(i')$;

cb) irrdiating the high frequency excitation pulse into the object;

cc) waiting time $t_w$';

cd) measuring only one measuring point $S(i')$ of a nuclear resonance signal from the object, the signal dephasing under the influence of the gradient magnetic field $G\phi(i')$, the measuring point $S(i')$ corresponding to a point in k-space lying along a vector extending from a k-space origin in the direction $\phi(i')$ of the gradient magnetic field $G\phi(i')$, whereby the separation of the point $S(i')$ in k-space from the k-space origin is given by a product of the strength $G(i')$ of the gradient magnetic field $G\phi(i')$ and the time $t_w$';

d) reconstructing an image of the object from a total number of n*(j–m) measuring points $S_{m+1}(i)$ to $S_j(i)$ plus n' measuring points $S(i')$ in k-space.

2. The method of claim 1, wherein all n gradient magnetic field strengths $G(i)$ of step ba) are larger than all n' gradient magnetic field strengths $G(i')$ of step ca).

3. The method of claim 2, wherein $\phi(i)$ varies in a plane and the direction increment $\phi(i+1)-\phi(i)$ as well as the magnetic gradient strength $G(i)$ stay the same for all n projections $p(i)$ so that the measuring points $S_q(i)$ for fixed q (m<q<j+1) lie on concentric circles in k-space.

4. The method of claim 2, wherein $\phi(i)$ and $G(i)$ for the n projections $p(i)$ are chosen such that the measuring points $S_q(i)$ for fixed q (m+1≤q≤j) lie on concentric rectangles in k-space.

5. The method of claim 3, wherein n'=n.

6. The method of claim 3, wherein n'<<n.

7. The method of claim 5, wherein the image reconstruction of the object is carried out with a projection reconstruction algorithm.

8. The method of claim 1 further comprising the step of determining new points in k-space form the n*(j–m) measuring points $S_{m+1}(i)$ to $S_j(i)$ plus n' measuring points $S(i')$ in k-space, the new points in k-space forming an even square grid in k-space, wherein image reconstruction of the object is carried out using the new points in k-space with the assistance of a 2d Fourier transform algorithm.

9. The method of claim 8 further comprising the step of subdividing, in a square measuring region, two-dimensional k-space into equally-sized rectangles each having a center assigned to a new point in k-space, wherein the new points in k-space are determined by assigning a point in k-space lying closest to a corresponding center of a corresponding rectangle to that corresponding center and by assigning zero to the corresponding center when no measuring point in k-space is located in the corresponding rectangle.

10. The method of claim 9, wherein $\phi(i)$, $G(i)$, $\phi(i')$, and $G(i')$ are adjusted in such a fashion that each of the equally-sized rectangles contains at least one measuring point $S_q(i)$ or $S(i')$ in k-space.

11. The method of claim 3, wherein the measuring points $S(i')$ lie on concentric circles in k-space.

12. The method of claim 2, wherein the measuring points $S(i')$ lie on concentric rectangles in k-space.

13. The method of claim 4, wherein the measuring points $S(i')$ lie on concentric rectangles in k-space.

14. The method of claim 1, wherein the directions of $\phi(i)$ and $\phi(i')$ vary in three dimensions, the method further comprising the step of determining new points in k-space from the total number of n*(j-m) measuring points $S_{m+1}(i)$ to $S_j(i)$ plus n' measuring points $S(i')$ in k-space, the new points in k-space forming a cubic grid in k-space, wherein image reconstruction of the object is carried out using the new points in k-space with the assistance of a 3d Fourier transform algorithm.

15. The method of claim 14, further comprising the step of subdividing, in a parallelepiped-shaped measuring region, a three-dimensional k-space into equally-sized parallelepipeds each having a center assigned to a new point in k-space, wherein the new points in k-space are determined by assigning a point in k-space lying closest to a corresponding center of a corresponding parallelepiped to that corresponding center and by assigning zero to the corresponding center when no measuring point in k-space is located in the corresponding parallelepiped.

16. The method of claim 15, wherein $\phi(i)$, $G(i)$, $\phi(i')$, and $G(i')$ are adjusted in such a fashion that each of the equally-sized parallelepipeds contains at least one measuring point in k-space.

17. A magnetic resonance method for imaging an object comprising the steps of:

a) locating the object in a homogeneous base magnetic field;

b) acquiring, using a back projection method n >>1 different projections by carrying out the following steps ba) to bd) n times with i=1 to n:

ba) applying a gradient magnetic field $G\phi(i)$;

bb) irradiating a high frequency excitation pulse into the object;

bc) waiting a time $t_w$';

bd) measuring (j–m)>>1 measuring points $S_{m+1}(i)$ to $S_j(i)$, which are sequential in time, of a nuclear resonance signal from the object;

c) acquiring, using a single point imaging method (SPI), n' additional measuring points $S(i')$ by carrying out the following steps ca) to cd) n' times with i'=1 to n':

ca) applying a gradient magnetic field $G\phi(i')$;

cb) irradiating the high excitation frequency pulse into the object;

cc) waiting the time $t_w$' cd) measuring exactly one measuring point $S(i')$ of a nuclear resonance signal from the object;

d) reconstructing an image of the object from measuring points $S_{m+1}(i)$ to $S_j(i)$ and measuring points $S(i')$.

18. The method of claim 17 further comprising the step of determining new points in k-space form the n* (j–m) measuring points $S_{m+1}(i)$ to $S_j(i)$ plus n' measuring points S(i') in k-space, the new points in k-space forming an even square grid in k-space, wherein image reconstruction of the object is carried out using the new points in k-space with the assistance of a 2d Fourier transform algorithm.

19. The method of claim 18 further comprising the step of subdividing, in a square measuring region, two-dimensional k-space into equally-sized rectangles each having a center assigned to a new point in k-space, wherein the new points in k-space are determined by assigning a point in k-space lying closest to a corresponding center of a corresponding rectangle to that corresponding center and by assigning zero to the corresponding center when no measuring point in k-space is located in the corresponding rectangle, wherein $\phi(i)$, $G(i)$, $\phi(i')$, and $G(i')$ are adjusted in such a fashion that each of the equally-sized rectangles contains at least one measuring point S(i') in k-space.

* * * * *